(12) United States Patent
Burkhart et al.

(10) Patent No.: US 10,373,794 B2
(45) Date of Patent: Aug. 6, 2019

(54) SYSTEMS AND METHODS FOR FILTERING RADIO FREQUENCIES FROM A SIGNAL OF A THERMOCOUPLE AND CONTROLLING A TEMPERATURE OF AN ELECTRODE IN A PLASMA CHAMBER

(71) Applicant: Lam Research Corporation, Fremont, CA (US)

(72) Inventors: Vince Burkhart, Cupertino, CA (US); Christopher Ramsayer, Tualatin, OR (US); Mohan Thilagaraj, Tualatin, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 656 days.

(21) Appl. No.: 14/965,030

(22) Filed: Dec. 10, 2015

(65) Prior Publication Data

US 2017/0125200 A1    May 4, 2017

Related U.S. Application Data

(60) Provisional application No. 62/247,979, filed on Oct. 29, 2015.

(51) Int. Cl.
*H01J 37/04* (2006.01)
*H01J 37/244* (2006.01)
(Continued)

(52) U.S. Cl.
CPC ............ *H01J 37/04* (2013.01); *H01J 37/244* (2013.01); *H01J 37/32522* (2013.01);
(Continued)

(58) Field of Classification Search
CPC .... H01J 37/04; H01J 37/244; H01J 37/32522; H01J 37/32935; H01J 37/32; H01J 37/34;
(Continued)

(56) References Cited

U.S. PATENT DOCUMENTS 5,175,472 A    12/1992    Johnson, Jr. et al.
5,556,501 A    9/1996    Collins et al.
(Continued)

FOREIGN PATENT DOCUMENTS

JP    2003068710 A    3/2003
JP    2006352040 A    12/2006

*Primary Examiner* — Ibrahime A Abraham
*Assistant Examiner* — Frederick F Calvetti

(57) ABSTRACT

A circuit including a first filter assembly and a controller. The first filter assembly is implemented on a printed circuit board. The first filter assembly includes a first filter and a second filter. The first filter receives a first signal from a first sensor, prevents passage of a first portion of the first signal and outputs a second signal. The first portion of the first signal is at a first radio frequency. A second portion of the first signal is indicative of a first temperature of a first electrode in a plasma chamber. The second filter receives the second signal and prevents passage of a portion of the second signal. The portion of the second signal is at a second radio frequency. The second radio frequency is less than the first radio frequency. The controller adjusts a temperature of the first electrode based on an output of the second filter.

19 Claims, 7 Drawing Sheets

(51) Int. Cl.
  *H05B 1/02* (2006.01)
  *H05H 1/48* (2006.01)
  *H01J 37/32* (2006.01)

(52) U.S. Cl.
  CPC ...... *H01J 37/32935* (2013.01); *H05B 1/0233* (2013.01); *H05H 1/48* (2013.01)

(58) Field of Classification Search
  CPC ........... H01J 37/32954; H01J 37/32724; H01J 37/32899; H01J 37/32174; H05B 1/0233; C23C 15/50; C23C 16/52; C23C 16/505; H05H 1/48; H05H 1/36
  USPC ...................................................... 236/91 R
  See application file for complete search history.

(56) References Cited

U.S. PATENT DOCUMENTS

| | | | |
|---|---|---|---|
| 5,806,980 A | 9/1998 | Berrian | |
| 6,036,878 A * | 3/2000 | Collins | H01J 37/321 216/68 |
| 6,054,013 A * | 4/2000 | Collins | H01J 37/321 118/723 I |
| 6,068,784 A | 5/2000 | Collins et al. | |
| 6,222,718 B1 | 4/2001 | Dible | |
| 6,367,411 B2 | 4/2002 | Ogawa et al. | |
| 6,384,540 B1 | 5/2002 | Porter, Jr. et al. | |
| 6,444,084 B1 * | 9/2002 | Collins | H01J 37/321 118/723 I |
| 6,447,655 B2 | 9/2002 | Lantsman | |
| 6,518,195 B1 | 2/2003 | Collins et al. | |
| 6,524,432 B1 * | 2/2003 | Collins | H01J 37/321 118/723 I |
| 6,727,655 B2 * | 4/2004 | McChesney | H01J 37/32082 156/345.24 |
| 6,737,939 B2 | 5/2004 | Hoppe et al. | |
| 6,849,154 B2 * | 2/2005 | Nagahata | H01J 37/32091 156/345.47 |
| 6,920,312 B1 | 7/2005 | Benjamin | |
| 7,276,135 B2 | 10/2007 | Dhindsa et al. | |
| 7,403,764 B2 | 7/2008 | Turner | |
| 7,405,521 B2 * | 7/2008 | Dhindsa | H01J 37/32082 118/723 R |
| 7,503,996 B2 | 3/2009 | Chen et al. | |
| 7,718,120 B2 | 5/2010 | Paskalov | |
| 7,777,152 B2 | 8/2010 | Todorov et al. | |
| 7,786,435 B2 | 8/2010 | Whitehouse et al. | |
| 8,238,129 B2 | 8/2012 | Unkrich | |
| 8,262,287 B2 | 9/2012 | Darabnia et al. | |
| 8,382,370 B2 | 2/2013 | Aggarwal et al. | |
| 8,419,958 B2 | 4/2013 | Wilson | |
| 8,613,984 B2 | 12/2013 | Aslami | |
| 8,616,765 B2 | 12/2013 | Darabnia et al. | |
| 8,673,078 B2 | 3/2014 | Hirono et al. | |
| 8,673,080 B2 | 3/2014 | Meinhold et al. | |
| 8,755,204 B2 | 6/2014 | Benjamin | |
| 8,779,662 B2 | 7/2014 | Boston | |
| 8,803,424 B2 | 8/2014 | Boston | |
| 8,932,430 B2 | 1/2015 | Srivastava et al. | |
| 9,020,451 B2 | 4/2015 | Khlat | |
| 9,034,142 B2 | 5/2015 | Bartlett et al. | |
| 9,041,365 B2 | 5/2015 | Kay et al. | |
| 9,441,294 B2 | 9/2016 | Yamamoto et al. | |
| 9,526,159 B2 | 12/2016 | Suh | |
| 9,670,588 B2 | 6/2017 | He | |
| 9,752,248 B2 | 9/2017 | Kagajwala et al. | |
| 2010/0230051 A1 | 9/2010 | Iizuka | |
| 2012/0097104 A1 | 4/2012 | Pipitone et al. | |
| 2013/0127124 A1 | 5/2013 | Nam et al. | |
| 2013/0316094 A1 | 11/2013 | Leeser et al. | |
| 2015/0354061 A1 | 12/2015 | Dhas et al. | |
| 2015/0357161 A1 | 12/2015 | Augustyniak et al. | |
| 2016/0049279 A1 | 2/2016 | Suh | |

\* cited by examiner

SYSTEMS AND METHODS FOR FILTERING RADIO FREQUENCIES FROM A SIGNAL OF A THERMOCOUPLE AND CONTROLLING A TEMPERATURE OF AN ELECTRODE IN A PLASMA CHAMBER

CROSS-REFERENCE TO RELATED APPLICATIONS

This application claims the benefit of U.S. Provisional Application No. 62/247,979, filed on Oct. 29, 2015. The entire disclosure of the application referenced above is incorporated herein by reference.

FIELD

The present disclosure relates to substrate processing systems, and more particularly to systems and methods for controlling temperatures of an electrode in a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching, deposition, and/or other treatment of substrates such as semiconductor wafers. Example processes include, but are not limited to, chemical vapor deposition (CVD), atomic layer deposition (ALD), and/or other etch, deposition, and cleaning processes. A substrate may be arranged on a substrate support such as a pedestal, an electrostatic chuck (ESC), etc. in a processing chamber of the substrate processing system. Different gas mixtures including one or more precursors may be introduced into the processing chamber and plasma may be used to actuate chemical reactions.

During processing of a substrate, temperatures of the substrate and components of the substrate processing system may vary. These temperature variations may have undesirable effects on the resulting substrates. Accordingly, the substrate processing systems may implement systems and methods for controlling temperatures of the substrate and components of the substrate processing system.

SUMMARY

A circuit is provided and includes a first filter assembly and a controller. The first filter assembly is implemented on a printed circuit board. The first filter assembly includes a first filter and a second filter. The first filter is configured to (i) receive a first signal from a first sensor, (ii) prevent passage of a first portion of the first signal, and (iii) output a second signal. The first portion of the first signal is at a first radio frequency. A second portion of the first signal is indicative of a first temperature of a first electrode in a plasma chamber. A second filter is configured to (i) receive the second signal, and (ii) prevent passage of a portion of the second signal. The portion of the second signal is at a second radio frequency. The second radio frequency is less than the first radio frequency. The controller is configured to adjust a temperature of the first electrode based on an output of the second filter.

In other features, a circuit is provided and includes a first filter assembly and a controller. The first filter assembly includes a band stop filter and a low pass filter. The band stop filter is configured to (i) receive a first signal from a first sensor, (ii) prevent passage of a first portion of the first signal, and (iii) and output a second signal. The first portion of the first signal is at a first radio frequency. A second portion of the first signal is indicative of a first temperature of a first electrode in a plasma chamber. The low pass filter is configured to (i) receive the second signal, and (ii) prevent passage of a portion of the second signal. The portion of the second signal is at a second radio frequency. The second radio frequency is less than the first radio frequency. The controller is configured to adjust a temperature of the first electrode based on an output of the low pass filter.

In other features, a method is provided and includes: receiving a first signal from a first sensor at a first filter; preventing passage of a first portion of the first signal via the first filter, where the first portion of the first signal is at a first radio frequency, and where a second portion of the first signal is indicative of a first temperature of a first electrode in a plasma chamber; outputting a second signal from the first filter; and receiving the second signal at a second filter. The method further includes: preventing passage of a portion of the second signal via the second filter, where the portion of the second signal is at a second radio frequency, where the second radio frequency is less than the first radio frequency, and where the first filter and the second filter are implemented on a printed circuit board; and adjusting a temperature of the first electrode based on an output of the second filter.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

In an effort to improve particle performance and throughput in a plasma chamber, a temperature of a showerhead is maintained at a predetermined temperature during substrate processing. The showerhead may include embedded heaters to heat the showerhead and a thermocouple to sense a temperature of the showerhead. The improved temperature control allows for increased accumulation levels while meeting particle requirements. As a result, a greater number of wafers may be processed between cleaning events, which improves productivity.

Intermittent coupling of DC may occur from the showerhead to conductors of the thermocouple. DC is caused by a high RF potential, which causes a "diode effect" or a nonlinear electrical response resulting in asymmetry between positive and negative halves of an electrical cycle. DC can also be supplied from a DC voltage supply source and is referred to as "a particle repulsion field (PRF)". The PRF charges the showerhead with a DC voltage to electrostatically mitigate particles shortly after the high RF potential is switched OFF.

Although the thermocouple may be insulated from the substrate processing chamber and the showerhead, DC begins to appear on the thermocouple as insulation of the thermocouple degrades. Degradation of the insulation causes DC leakage and/or coupling between the thermocouple and the showerhead. Additionally, RF signals supplied to the showerhead can strongly couple to the thermocouple embedded in the showerhead. While the RF signals of a station may be isolated before reaching its corresponding temperature controller, the RF signals can couple to other nearby stations or to a ground reference, which may cause RF imbalance, arcing, and RF noise. The RF power may be different from one station to another which causes different levels of DC coupling.

Temperature measurements output by the thermocouple are relatively small DC voltages. These temperature measurements are overcome by DC coupling signals when DC coupling occurs. Temperature control systems and methods according to the present disclosure include filter circuits and assemblies that substantially reduce the effects of DC coupling.

Figure 1:
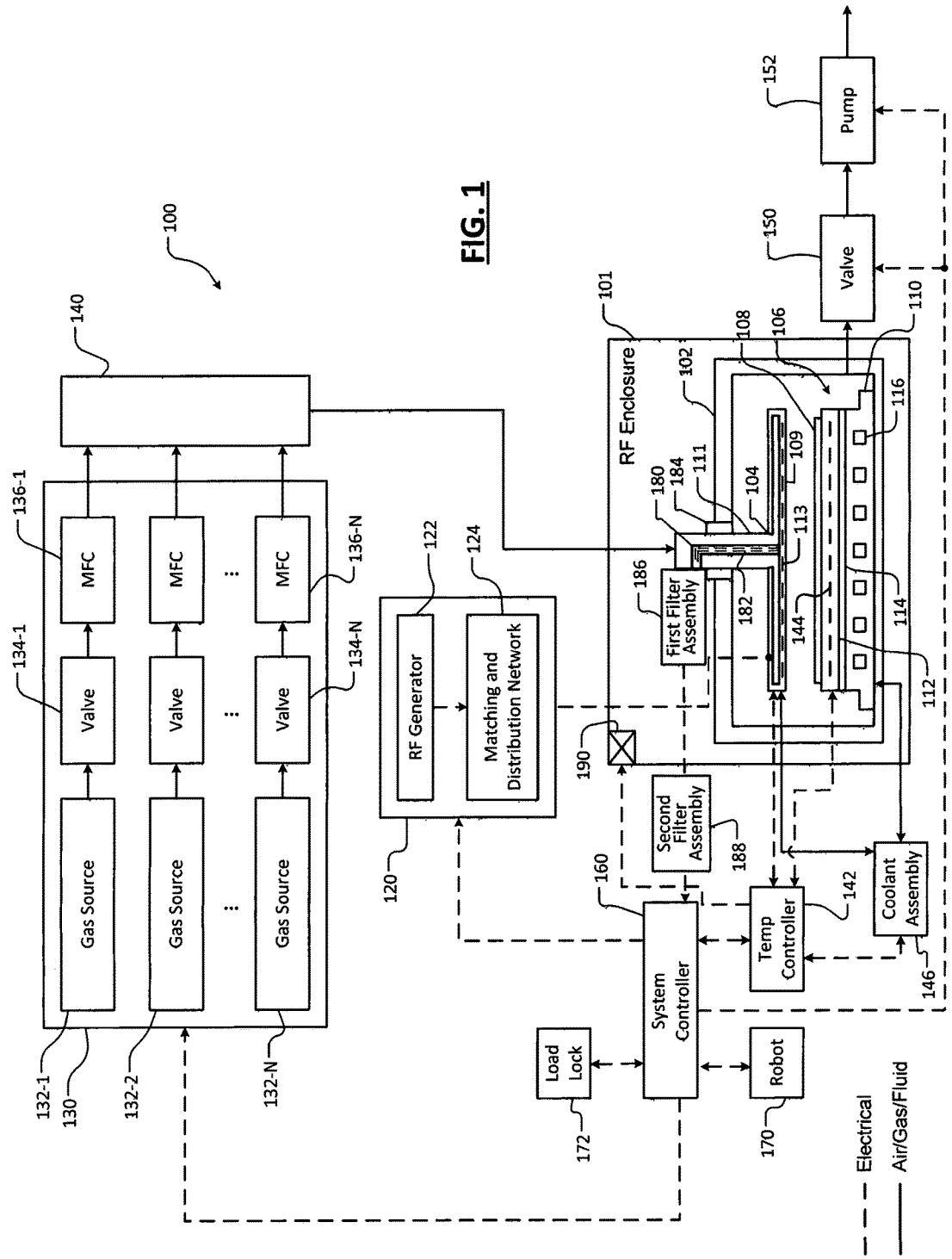
FIG. 1 is a functional block diagram of an example of a substrate processing system incorporating filter assemblies according to the present disclosure.

Referring now to FIG. 1, a substrate processing system 100 for performing etching using RF plasma is shown. While a PECVD chamber is shown, the systems and methods described herein may be used in other processes. The substrate processing system 100 includes an RF enclosure 101 that may be at atmospheric pressure or another pressure. A processing chamber 102 is located in the RF enclosure 101. The processing chamber 102 encloses other components of the processing chamber 102 and contains the RF plasma. The processing chamber 102 includes an upper electrode 104 and a substrate support 106. During operation, a substrate 108 is arranged on the substrate support 106.

For example only, the upper electrode 104 may be a showerhead 109 that distributes gases. The upper electrode 104 may include a stem portion 111 including one end connected to a top surface of the processing chamber 102. A base portion of the showerhead 109 is generally cylindrical and extends radially outwardly from an opposite end of the stem portion 111 at a location that is spaced from the top surface of the processing chamber 102. A substrate-facing surface of the showerhead 109 includes a plate with holes through which process or purge gas flows. The showerhead 109 includes heating elements 113. The showerhead 109 may also include cooling channels (not shown) that flow cooling gas or fluid. Examples of a showerhead 109 having cooling channels is shown and described in U.S. application Ser. No. 13/900,627, filed on May 23, 2013 and titled "RE-Powered, Temperature-Controlled Gas Diffuser", which is incorporated herein by reference in its entirety.

The substrate support 106 includes a conductive baseplate 110 that acts as a lower electrode. The baseplate 110 supports a heating plate 112, which may be formed at least partially of a ceramic material. A thermal resistance layer 114 may be arranged between the heating plate 112 and the baseplate 110. The baseplate 110 may include one or more channels 116 for flowing coolant through the baseplate 110.

A RF generating system 120 generates and outputs RF power to the upper electrode 104. The baseplate 110 may be DC grounded, AC grounded or at a floating potential. For example only, the RF generating system 120 may include an RF generator 122 that generates the RF power, which is fed by a matching and distribution network 124 to the upper electrode 104. In one embodiment, RF power is provided at two or more frequencies to the upper electrode 104. For example only, RF power is supplied at a first frequency (e.g., 13.56 mega-hertz (MHz)) and RF power is also supplied at a second frequency (e.g., 400 kilo-hertz (kHz)). The first frequency may be higher than an ion cut-off frequency to excite electrons and not ions in a plasma. The second frequency may be less than the ion cut-off frequency to excite both ions and electrons in the plasma.

A gas delivery system 130 includes one or more gas sources 132-1, 132-2, . . . , and 132-N (collectively gas sources 132), where N is an integer greater than zero. The gas sources 132 supply one or more precursors and mixtures thereof. The gas sources 132 may also supply purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the showerhead 109.

A temperature controller 142 may be connected to temperature controlled elements (TCEs) 144 arranged in the heating plate 112. Although shown separately from a system controller 160, the temperature controller may be implemented as part of the system controller 160. The temperature controller 142 may control the temperatures of the heating elements 113 and the TCEs 144 to control temperatures of the upper electrode 104 and the substrate support 106, respectively. The temperature controller 142 may communicate with a coolant assembly 146 to control coolant through the channels 116 of the baseplate 110. For example, the coolant assembly 146 may include a coolant pump, a reservoir and flow control devices such as valves and/or mass flow controllers.

A valve 150 and pump 152 may be used to control pressure in the processing chamber 102 and to selectively evacuate reactants from the processing chamber 102. The system controller 160 may control components of the substrate processing system 100.

The upper electrode 104 includes one or more thermocouples (one thermocouple 180 having conductors 182 is shown). The thermocouple 180 extends through the stem 111 and into the showerhead 109. The stem 111 is sealed to the plasma chamber 102 via a seal 184. The conductors 182 are received at a first filter assembly 186, which may include a printed circuit board assembly (PCBA). The output of the first filter assembly 186 may be provided to a second filter assembly 188. The second filter assembly 188 may be located within the RF enclosure 101 or may be external to the RF enclosure 101, as shown. Examples of the filter assemblies are shown in FIGS. 2-8.

The first filter assembly 186 and optionally the second filter assembly 188 may be located in the RF enclosure 101. The first filter assembly 186 is located in close proximity to the thermocouple 180 and upper electrode 104 to minimize and block radio frequencies on the conductors 182 and other conductors. Examples of the other conductors include (i) conductors between the first filter assembly 186 and the second filter assembly 188, and/or (ii) conductors between (a) the second filter assembly 188 and (b) temperature controller 142 or an isolation device (shown in FIGS. 2-5)). The first filter assembly 186 may be connected to the stem 111 and/or to the plasma chamber 102 near the stem 111. The close proximity of the first filter assembly 186 to the thermocouple 180, stem 111, and/or the upper electrode 104 minimizes RF and/or DC anomalies.

One or more fans 190 may be arranged in the RF enclosure 101 and used to maintain temperatures within the RF enclosure 101 at a predetermined temperature (e.g., 70° C.). This may aid in maintaining temperatures of the first filter assembly 186 and/or the second filter assembly 188 at the predetermined temperature. The fans 190 may be turned ON and OFF by the temperature controller 142. The temperature controller 142 may control and adjust a duty cycle of control signals provided to each of the fans. The duty cycles may be adjusted based on temperatures detected in the RF enclosure 101, on the first filter assembly 186, and/or via the thermocouple 180. For example, an ON time per cycle of a control signal of a fan may be increased when a detected temperature increases to provide additional cooling. One or more of the fans 190 may be dedicated to controlling a temperature of the first filter assembly 186. This allows for convective cooling of components on the first filter assembly 186. Temperature differences across the first filter assembly 186 may be minimized by maintaining the components on the first filter assembly 186 at a same predetermined temperature (e.g., 70° C.). This prevents introduction of DC due to temperature differences across a PCB of the first filter assembly 186, as will be described further below. The fans 190 may be located anywhere in the RF enclosure 101.

Figure 2:
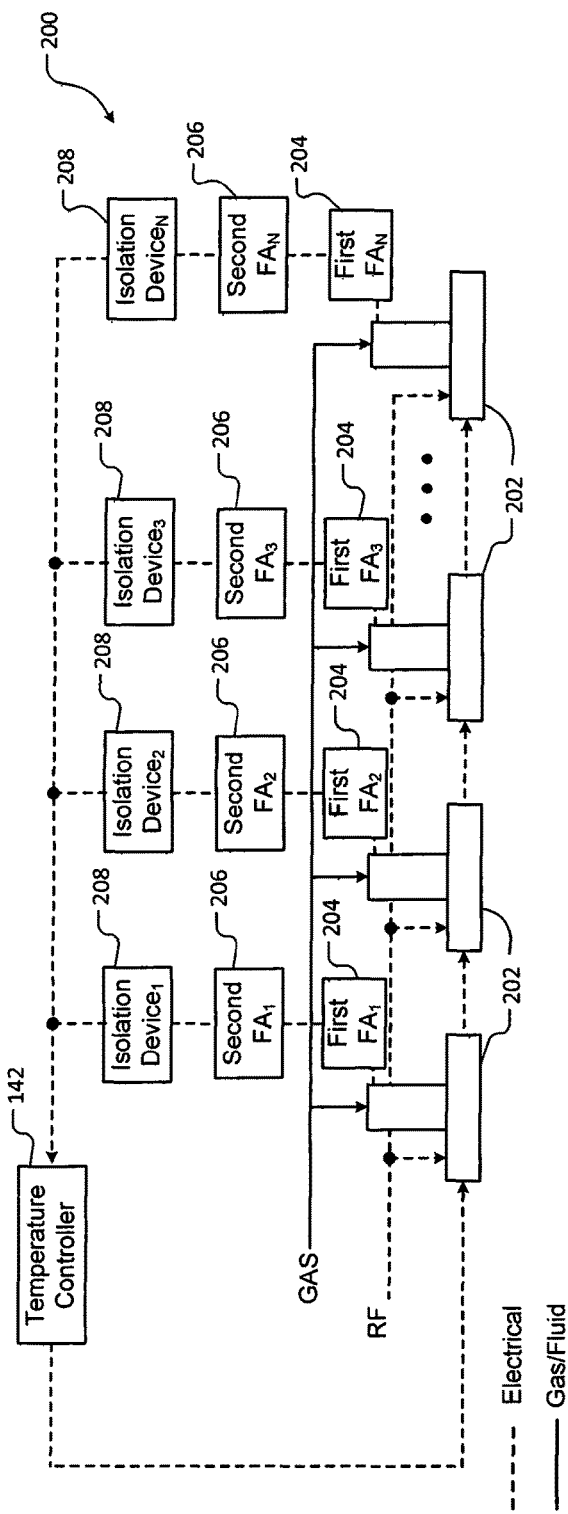
FIG. 2 is a functional block diagram of an example of a temperature control system for electrodes of multiple stations according to the present disclosure.

FIG. 2 shows a temperature control system 200 for electrodes 202 of multiple stations. In some examples, the stations may be arranged on a carousel in the plasma chamber 102 of FIG. 1. The electrodes 202 include the upper electrode 104 of FIG. 1 and receive RF signals as described above. Gas may be provided to the electrodes 202 for plasma processing. The electrodes 202 have respective first filter assemblies 204, second filter assemblies 206, and isolation devices 208. The first filter assemblies 204 are connected to thermocouples (e.g., an example of which is shown by the thermocouple 180 of FIG. 1) in the electrodes 202. Outputs of the thermocouples 180 are connected to the first filter assemblies 204. Outputs of the first filter assemblies 204 are connected to the second filter assemblies 206. Outputs of the second filter assemblies 206 are connected to the isolation devices 208. Outputs of the isolation devices 208 are connected to the temperature controller 142, which controls current supplied to heating elements in the electrodes 202 based on temperatures detected via the thermocouples. In one embodiment, the second filter assemblies 206 are not included and the outputs of the first filter assemblies are provided directly to the isolation devices 208.

The first filter assemblies, as further described below, include a filter for each conductor of each of the thermocouples. Each thermocouple may include multiple conductors. Each filter assembly may include a band stop filter and a low pass filter connected in series as further described below with respect to FIGS. 7 and 9. The second filter assemblies may include low pass filters respectively for the conductors of the thermocouples as further described below with respect to FIG. 8.

The isolation devices 208 may be separate from the temperature controller 142 or may be integrated as part of the temperature controller 142. The isolation devices 208 may include amplifiers and/or isolation elements for decoupling low voltage differential signals received from the thermocouple conductors from self-biased DC voltages of plasma. The isolation devices 208 may amplify condition received signals and remove residual DC interference. Each of the isolation devices 208 measures a received voltage, compares the received voltage to a non-linear thermocouple curve, calculates an internal temperature of the isolation device based on the received signal and the non-linear thermocouple curve and encodes the temperature into a linear analog voltage which it outputs. The self-biased DC voltages can couple into embedded thermocouple lines in a showerhead. High RF voltage potentials, such as that provided to a showerhead, can erode thermocouple electrical isolation. This can cause an inaccurate DC voltage reading and improper control of heating elements within the showerhead. The isolation devices 208 block the DC associated with the plasma and other DC voltages (e.g., a PRF voltage) and allow for accurate thermocouple DC voltage readings for accurate heater element control. The other DC voltages may be relative to a chassis ground.

Figure 3:
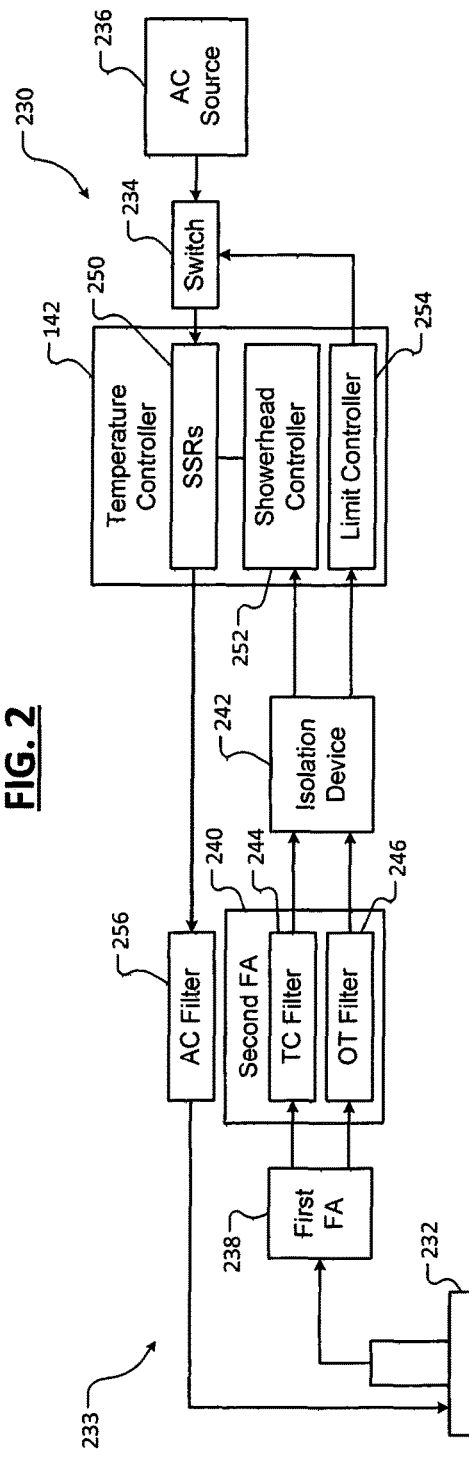
FIG. 3 is a functional block diagram of an example of a temperature control system for a single electrode according to the present disclosure.

FIG. 3 shows a temperature control system 230 for a single electrode 232, which may replace the upper electrode 104 or any of the electrodes 202 of FIGS. 1-2. The temperature control system 230 includes the temperature controller 142, a filter circuit 233, and a switch 234 and may include an AC source 236. The filter circuit 233 includes a first filter assembly 238, a second filter assembly 240, and an isolation device 242. Although the isolation device 242 is shown as being separate from the temperature controller 142, the isolation device 242 and the temperature controller 142 may be implemented as a single device. The first filter assembly 238 may include a PCB and multiple filters for each conductor of a thermocouple in the electrode 232. The filter for each conductor of the thermocouple includes a band stop filter and a low pass filter.

Figure 8:
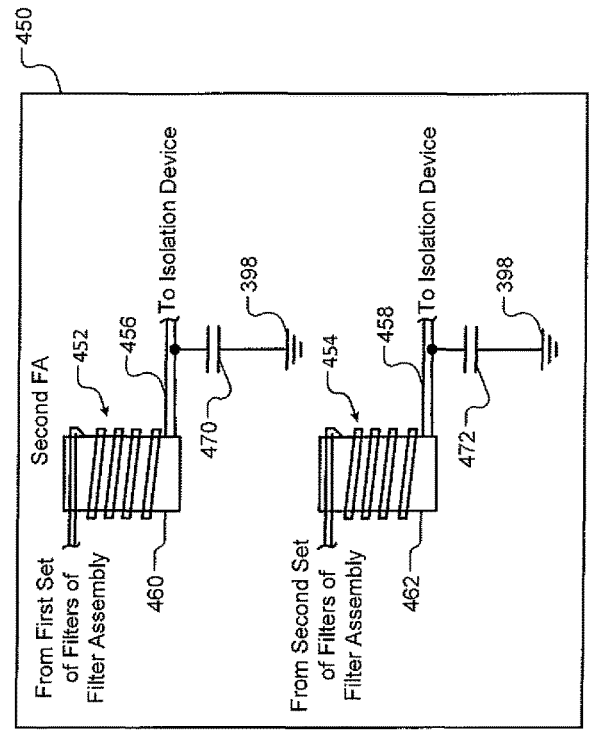
FIG. 8 is a side view of an example of a core-based filter assembly according to the present disclosure.

The thermocouple may include multiple pairs of conductors, where each pair of conductors effectively operates as a respective thermocouple. The second filter assembly 240 may include a thermocouple (TC) filter 244 and an over temperature (OT) filter 246, which may be connected to an over temperature monitor. Outputs of the first filter assembly 238 associated with a first pair of conductors may be connected to the thermocouple filter 244. Outputs of the first filter assembly 238 associated with a second pair of conductors may be connected to the over current filter 246. The filters 244, 246 may be low pass filters and may include wrapping thermocouple conductors around respective iron cores, examples of which are shown in FIG. 8.

The temperature controller 142 may include solid-state relays 250, a showerhead controller 252 and a limit controller 254. The solid-state relays 250 may receive RF power from the AC source 236 via the switch 234. The switch 234 may be referred to as a safety contactor. The AC power may be provided via an AC filter 256 to the electrode 232. The limit controller 254 may control operation of the switch 234 based on first outputs of the isolation device 242 corresponding to outputs of the over current filter 246. The showerhead controller 252 controls operation of the solid-state relays 250 based on second outputs of the isolation device 242 corresponding to outputs of the thermocouple filter 244. The solid-state relays 250 may be controlled to supply RF power to the electrode 232. The AC filter 256 may include bandpass and/or high pass filters to permit passage of RF signals at predetermined frequencies and to prevent passage of DC and/or noise.

Temperature of the first filter assembly 238 may be maintained using open loop control or closed loop control. In one embodiment, the first filter assembly 238 is temperature regulated and/or cooled via conductive cooling. This may include a fan circulating or passing air across the first filter assembly 238 as similarly described above with respect to the fans 190 of FIG. 1. Examples of closed loop control are described below with respect to FIGS. 4-5.

Figure 4:
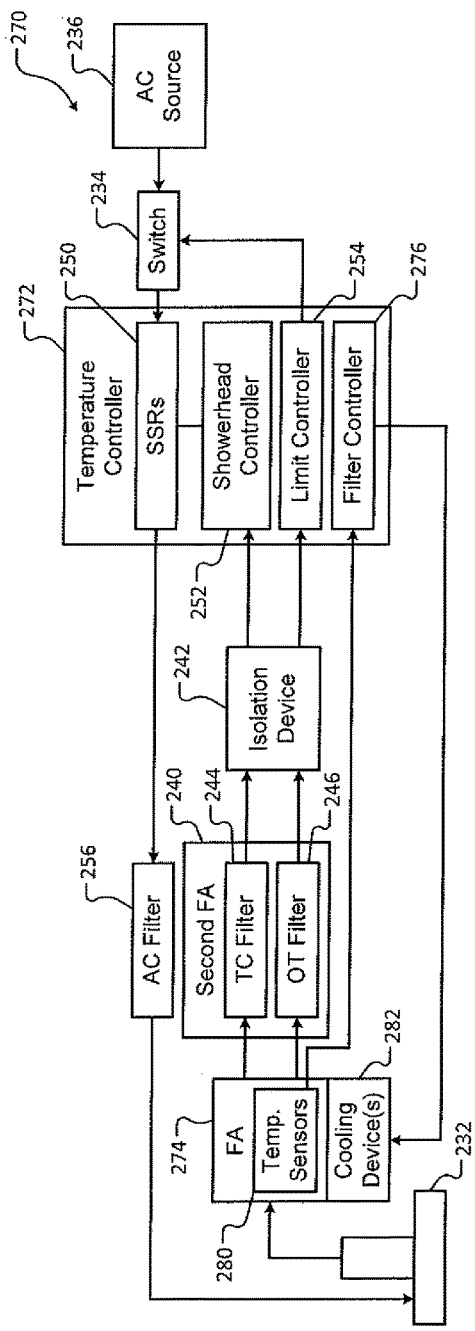
FIG. 4 is a functional block diagram of an example of a temperature control system for a single electrode illustrating closed loop temperature control of a filter assembly according to the present disclosure.

FIG. 4 shows a temperature control system 270 for the electrode 232. The temperature control system 270 includes a temperature controller 272, a first filter assembly 274, the second filter assembly 240, and the isolation device 242 and may include the switch 234 and the AC source 236. The temperature controller 272 includes the solid-state relays 250, the showerhead controller 252 and the limit controller 254. The second filter assembly 240 includes the thermocouple filter 244 and the over current filter 246. The temperature controller 272 also includes a filter controller 276, which performs closed loop temperature control of the first filter assembly 274.

Figure 5:
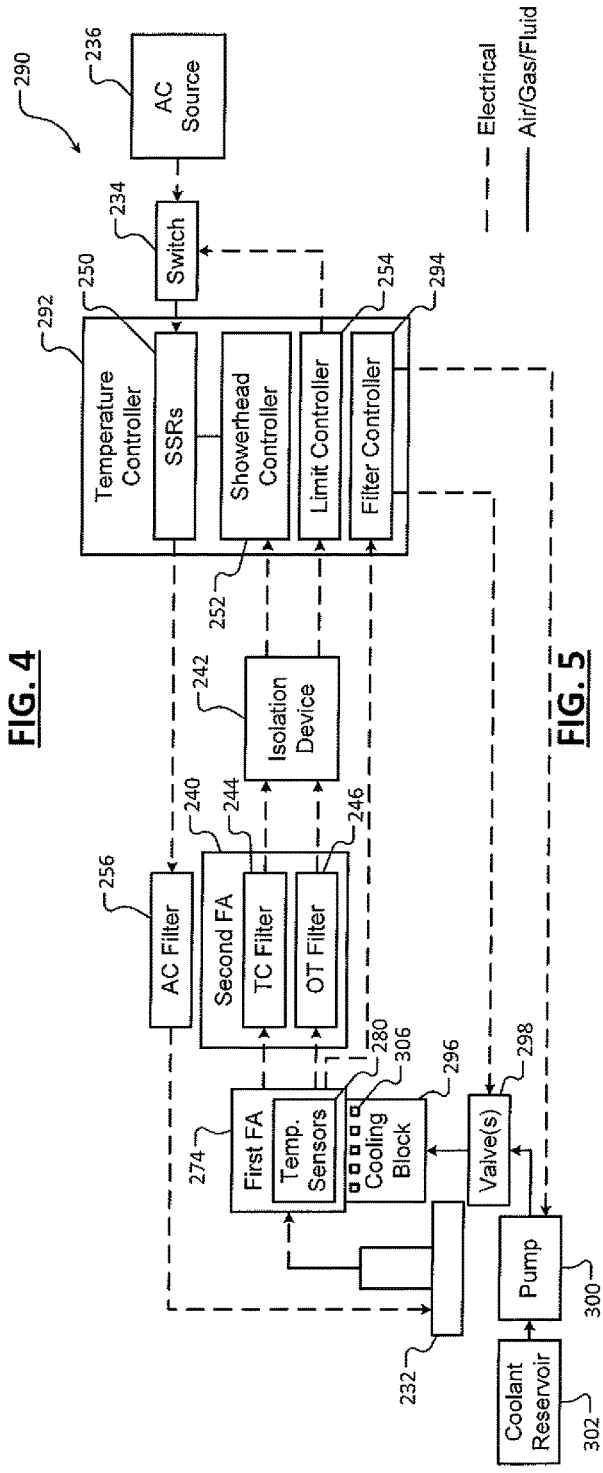
FIG. 5 a functional block diagram of another example of a temperature control system for a single electrode illustrating closed loop temperature control of a filter assembly according to the present disclosure.
Figure 7:
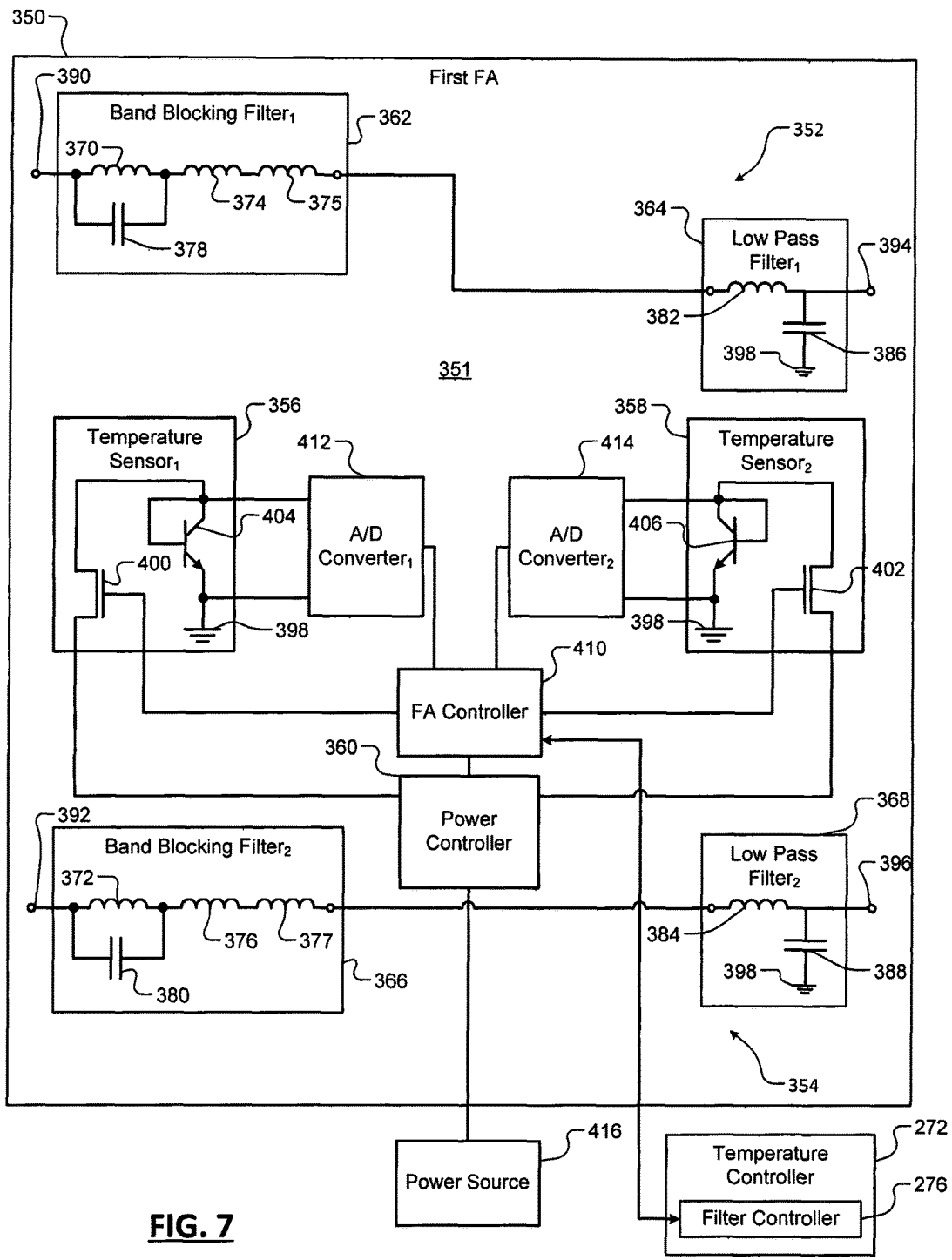
FIG. 7 is a functional block diagram and schematic of an example of a filter assembly according to the present disclosure.

The first filter assembly 274 may include temperature sensors 280 and one or more cooling devices 282. The temperature sensors 280 may be connected to a PCB of the first filter assembly 274 near thermocouple signal inputs and outputs of the PCB. Temperature signals generated by the temperature sensors 280 are provided to the filter controller, which regulates temperatures of the first filter assembly 274 to be at a same temperature. The cooling devices 282 may include air or fluid cooling devices, such as one or more fans, valves, switches, pumps, etc. One example embodiment of the cooling devices 282 is shown in FIG. 5. The filter controller 276 controls operation of the cooling devices 282 to adjust temperatures of the first filter assembly 274. The filter controller 276 may control temperatures of one or more filter assemblies of one or more stations. The filter controller 276 may communicate with a controller on the PCB of the first filter assembly 274 or may be included on a PCB of the first filter assembly 274. An example PCB of the first filter assembly 274 is shown in FIG. 7.

FIG. 5 shows another temperature control system 290 for the electrode 232. The temperature control system 290 includes a temperature controller 292, the first filter assembly 274, the second filter assembly 240, and the isolation device 242 and may include the switch 234 and the AC source 236. The temperature controller 292 includes the solid-state relays 250, the showerhead controller 252 and the limit controller 254. The second filter assembly 240 includes the thermocouple filter 244 and the over current filter 246. The temperature controller 292 also includes a filter controller 294, which performs closed loop temperature control of the first filter assembly 274.

The first filter assembly 274 may include the temperature sensors 280 and one or more cooling devices or other temperature adjusting devices (e.g., heaters). The cooling devices may include a cooling block 296, valves 298, a pump 300 and a coolant reservoir 302. The cooling block 296 may be in close proximity of, thermally connected to, directly connected to and/or indirectly connected to the first filter assembly 274 and/or a PCB of the first filter assembly 274. The temperature sensors 280 may be connected to the PCB of the first filter assembly 274 near thermocouple signal inputs and outputs of the PCB. Temperature signals generated by the temperature sensors 280 are provided to the filter controller 294, which regulates temperatures of the first filter assembly 274 to be at a same temperature. The filter controller 294 controls operation of the valves 298, pump 300, and/or other temperature adjusting devices to adjust flow of a coolant to and from channels 306 of the cooling block 296 to adjust temperatures of the first filter assembly 274. This may include zoned cooling including, for example, operating the valves 298 to independently control fluid flow rates and/or pressures in the channels 306. This allows different zones of the PCB to receive different amounts of cooling. The filter controller 294 may control temperatures of one or more filter assemblies respectively of one or more stations, where each of the stations has a cooling block and corresponding first filter assembly. The filter controller 294 may communicate with a controller on the PCB of the first filter assembly 274 or may be included on the PCB of the first filter assembly 274. An example PCB of the first filter assembly 274 is shown in FIG. 7.

Figure 6:
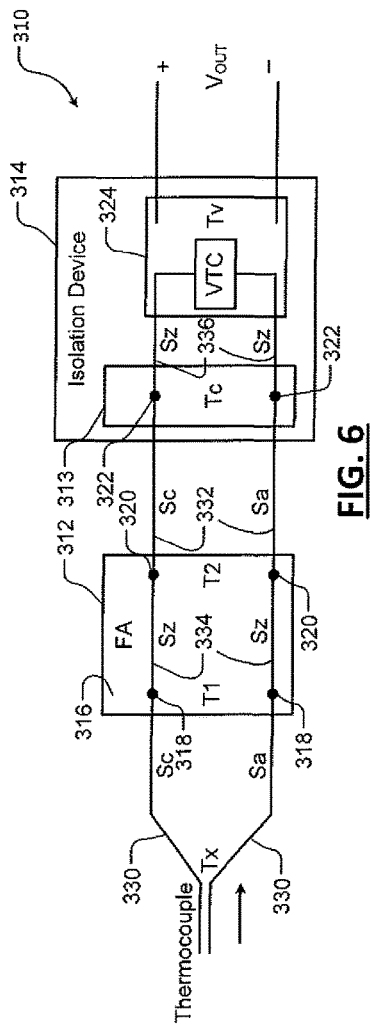
FIG. 6 is example of an equivalent circuit representation for a filter assembly and an isolation device of a thermocouple according to the present disclosure.

FIG. 6 shows an equivalent circuit representation 310 for a filter assembly 312 and an isolation device 314 of a thermocouple. This equivalent circuit representation 310 may represent portions of the first filter assemblies and isolation devices of FIGS. 1-5 associated with a single pair of conductors of a thermocouple and does not represent a second filter assembly (e.g., one of the second filter assemblies 188, 206, 240 of FIGS. 1-5). The first filter assembly 312 includes a PCB 316, input terminals 318, and output terminals 320. The isolation device 314 includes a connector 313 with terminals 322 and a signal conditioning circuit 324 having as an input, a thermocouple voltage VTC, and an output voltage VOUT.

Pairs of thermocouple conductors 330, 332 are shown (i) between the thermocouple and the first filter assembly 312, and (ii) between the first filter assembly 312 and the connector 313 of the isolation device 314. The thermocouple conductors 330, 332 are connected to corresponding ones of the terminals 318, 320, 322. Pairs of PCB conductors or integrated circuit (IC) conductors (e.g., copper traces) 334, 336 are shown (i) between the first pair of thermocouple conductors 330 and the second pair of thermocouple conductors 332, and (ii) between the second pair of thermocouple conductors 332 and the input of the signal conditioning circuit 324. The isolation device 314 and/or the signal conditioning circuit 324 performs an analog-to-digital-to-analog conversion to provide a digitally scaled analog output (the output voltage $V_{OUT}$). The signal conditioning circuit 324 measures a thermocouple open circuit voltage VTC with a high impedance circuit to minimize loop current.

Each of the pairs of thermocouple conductors 330, 332 has conductors made of different materials, such that conductors of each of the pairs of thermocouple conductors 330, 332 has a respective Seebeck coefficient Sa or Sc, as shown. In addition, the conductors 334, 336 have a corresponding Seebeck coefficient Sz. The Seebeck coefficient Sa may be for conductors that include nickel and aluminum. The Seebeck coefficient Sc may be for conductors that include nickel and chromium. The Seebeck coefficient Sz may be for conductors that include copper. Temperatures Tx, T1, T2, Tc and Tv are shown for the temperatures respectively at (i) the output of the thermocouple, (ii) the terminals 318, (iii) the terminals 320, (iv) the terminals 322, and (v) a point on or an output of the signal conditioning circuit 324.

According to Kirchoff's voltage law, a sum of all voltages around a closed loop is zero. Thus, the sum of the voltages around the loop of the equivalent circuit representation 310 is as shown by equation 1. Rearranging and simplifying equation 1 provides equation 2.

$$Sc(tx-T1)+Sz(T1-t2)+Sc(T2-Tc)+Sz(Tc-Tv)+VTC+Sz(Tv-Tc)+Sa(Tc-T2)+Sz(T2-T1)+Sa(T1-Tx)=0 \quad (1)$$

$$(Sa-Sc)(T2-T1+Tx-Tc)=VTC \quad (2)$$

The values of Sa and Sc determine polarity of VTC. If 12 is equal to T1, then the magnitude of VTC is based on the difference between Tx and Tc, where Tx is the unknown temperature detected by the thermocouple and Tc is a temperature of the connector 313. If T2 is not equal to T1, then the magnitude of the voltage VTC is also based on the difference between T2 and T1. For this reason and as disclosed herein, temperatures of T2 and T1 are maintained at a same temperature. Sensors may be used to detect the temperatures T2 and T1. Example sensors are shown in FIG. 7. The filter controllers 276, 294 of FIGS. 4, 5 may maintain the temperatures T2 and T1 at the same temperature. In one embodiment, the temperatures are maintained at a fixed temperature without detecting the temperatures T2, T1 (referred to as open loop control). For example, the temperature controller 142 of FIG. 1 may control operation of the fans 190 based on a current recipe and predetermined estimates of the temperatures T2 and T1 for various times during a process. The temperature controller 142 may store and/or have access to a table of estimates of T2 and T1 for different operating conditions and times during a process being performed. The temperature controller 142 may adjust current, voltage, power, frequency, and/or duty cycle of one or more of the fans 190. Closed loop control may also include controlling current, voltage, power, frequency, and/or duty cycle of one or more of the fans 190 based on measurements of T2 and T1. Closed loop control may control open and closed states of valves, ON and OFF states of pumps, speeds of pumps, how much valves are open, frequency of valve openings, etc.

The first filtering assemblies disclosed herein are implemented on PCBAs and provide RF filtering with compact and repeatable designs for ease of manufacturing. A thermocouple conductor when interfacing with a copper trace of a PCB can generate a small voltage due to a thermoelectric effect (referred to as a Seebeck effect), which can affect a temperature measurement. To prevent this small voltage from being generated, the PCBAs are mounted in an RF enclosure, which is maintained at a predetermined or ambient temperature (e.g., 70° C.). A corresponding temperature controller may be exposed to the predetermined or ambient temperature. The PCBAs may be temperature controlled to prevent any temperature gradients from arising. This is because a Seebeck effect is primarily affected at dissimilar metal junctions. Although thermoelectric voltages can arise, consistent with Kirchoff's voltage law, the effects of the dissimilar metal junctions disclosed herein along with temperature control of the PCBAs cause the junctions to nullify each other leaving only an originally detected thermocouple voltage. In contrast, traditional techniques for mitigating DC voltages use differential amplifiers, which (i) have a small range of DC voltages that can be isolated, and (ii) exhibit finite common mode rejection, resulting in larger errors when a high DC noise to signal ratio exists.

FIG. 7 shows an example of the first filter assembly 350, which may be a PCBA, having a PCB 351. The first filter assembly 350 includes first filters 352, second filters 354, a first temperature sensor 356, a second temperature sensor 358, and a power controller 360. The first filters 352 include a first filter 362 (shown as a band stop filter) and a second filter 364 (shown as a low pass filter). The second filters 354 include a first filter 366 (shown as a band stop filter) and a second filter 368 (shown as a low pass filter). The first filters 362, 366 prevent passage of RF power at frequencies within a first frequency band, which may be centered at or near a first frequency (e.g., 13.56 MHz). RF power at the first frequency may be supplied to a showerhead and be detected by a thermocouple. The first filters 362, 366 permit passage of RF power at frequencies outside of the first frequency band. The second filters 364, 368 prevent passage of RF power at frequencies above a cut-off frequency (e.g., 100 kHz) and permit passage of RF power at frequencies below the cut-off frequency. The frequencies above the cut-off frequency may be referred to as a second frequency band. Frequencies below the cut-off frequency may be referred to as a third frequency band. As a result, RF power at a second frequency (e.g., 400 kHz), supplied to the showerhead and detected by the thermocouple, may be blocked by the second filters 364, 368. RF power at the first RF frequency and the second RF frequency may be provided to an electrode in a plasma chamber, as described above.

The filters 362, 366 include corresponding inductances 370, 372, 374, 375, 376, 377 and capacitances 378, 380. The filters 364, 368 include respective inductances 382, 384 and capacitances 386, 388. The inductances 370, 374, 375 are connected in series between input terminal 390 and the inductance 382. The inductances 372, 376, 377 are connected in series between input terminal 392 and the inductance 394. In one embodiment, values of each of the inductances 370 and 372 are less than values of each of the inductances 374, 375, 376, 377. The values of the inductances 374, 375, 376, 377 may be the same. The input terminals 390, 392 may be connected to conductors of the thermocouple. The inductances 382, 384 are connected to output terminals 394, 396. The inductances 370, 372 are connected in parallel with the capacitances 378, 380. The capacitances 386, 388 are connected between outputs of the inductances 382, 384 and a ground reference 398.

The temperature sensors 356, 358 are shown as examples. For example purposes only, the temperature sensors 356, 358 may include first transistors and second transistors. The first transistors may be transitioned between states to supply current to the second transistors. This may turn ON the temperature sensors 356, 358. The temperature sensors 356, 358 and/or the second transistors may be configured to detect temperatures of and/or near the input terminals 390, 392 and the output terminals 294, 296. The temperature sensors 356, 358 may be in contact with the terminals 390, 392, 394, 396. Although two temperature sensors are shown any number of temperatures sensors may be included. As another example, a temperature sensor may be provided for each of the terminals 390, 392, 394, 396.

The temperature sensors 356, 358 may be connected to and receive current from the power controller 360. The temperature sensors 356, 358 may be connected to and receive control signals from a filter assembly controller 410 or one of the filter controllers of FIGS. 4, 5. Outputs of the temperature sensors 356, 358 may be may be connected to analog-to-digital (A/D) converters. Outputs of the A/D converters may be provided to the filter assembly controller 410 or one of the filter controllers of FIGS. 4 and 5. The A/D converters may be included in the filter assembly controller 410.

As an example, the first transistors of the temperature sensors 356, 358 may be metal-oxide-semiconductor field-effect transistors (MOSFETs) and include drains, gates and sources. The second transistors of the temperature sensors 356, 358 may be bipolar junction transistors (BJTs) and include collectors, bases and emitters. The drains may be connected to and receive current from the power controller 360. The gates may be connected to and receive control signals from a filter assembly controller 410 or one of the filter controllers of FIGS. 4, 5. The sources of the first transistors may be connected to the collectors and the bases. The emitters may be connected to the ground reference 398. The collectors and the emitters may be connected to the A/D converters. Outputs of the A/D converters may be provided to the filter assembly controller 410 or one of the filter controllers of FIGS. 4 and 5.

The second transistors may be connected in diode configurations. Temperature dependence of base-to-emitter voltages of the second transistors may be the basis for temperature measurements. The base-to-emitter voltages Vbes may be dependent on temperatures while (i) a power source 416 supplies power via the power module 360 with a constant level of current to the collectors via the first transistors, and (ii) a voltage across the bases and the collectors is zero. The voltages across the bases (or collectors) and the emitters of the second transistors may be detected by the A/D converters and/or the filter assembly controller 410. The detected voltages may be converted to temperatures via the filter assembly controller 410 or one of the filter assembly controllers of FIGS. 4 and 5. The filter assembly controller 410 or one of the filter assembly controllers of FIGS. 4 and 5 may receive digital signals from the A/D converters and determine the temperatures of the terminals 390, 392, 394, 396 (e.g., temperatures T2, T1 of FIG. 6). The filter assembly controller 410 is shown as being connected to the temperature controller 272 and is in communication with the filter controller 276. Although certain types of temperature sensors are shown and described, other types of temperature sensors maybe utilized.

FIG. 8 shows an example of a second filter assembly (a core-based assembly) 450. The second filter assembly 450 may replace any of the second filter assemblies of FIGS. 1-5. The second filter assembly 450 includes a first low pass filter 452 and a second low pass filter 454. The filters 452, 454 include respective thermocouple cables 456, 458, which are wrapped around corresponding ferrite cores 460, 462 to provide inductances. Although two cores 460, 462 are shown, a common mode choke may be used, whereby the thermocouple cables are wrapped around respective portions of a single core (e.g., a ring-shaped core). Each of the thermocouple cables 456, 458 includes an outer sheath and a pair of conductors. First ends of conductors in the thermocouple cables 456, 458 may be connected to output terminals of a first filter assembly (any of the first filter assemblies of FIGS. 1-7). Second ends of the conductors in the thermocouple cables 456, 458 may be connected to input terminals of an isolation device (e.g., any of the isolation devices of FIGS. 1-6). Capacitances 470, 472 are connected to the sheaths at the outputs of the inductances and to the ground reference 398. The filters 452, 454 may supplement the filters of a first filter assembly (e.g., the first filter assembly 350 of FIG. 7) and block frequencies above a cut-off frequency of the filters 452, 454. The cut-off frequency of the filters 452, 454 may be the same or different than the cut-off frequency of the low pass filters of the first filter assembly. The primary purpose of the filters 452, 454 is to filter out noise that was coupled to the signal lines by radiation inside the RF chamber or otherwise picked up after the first filter assembly.

Figure 9:
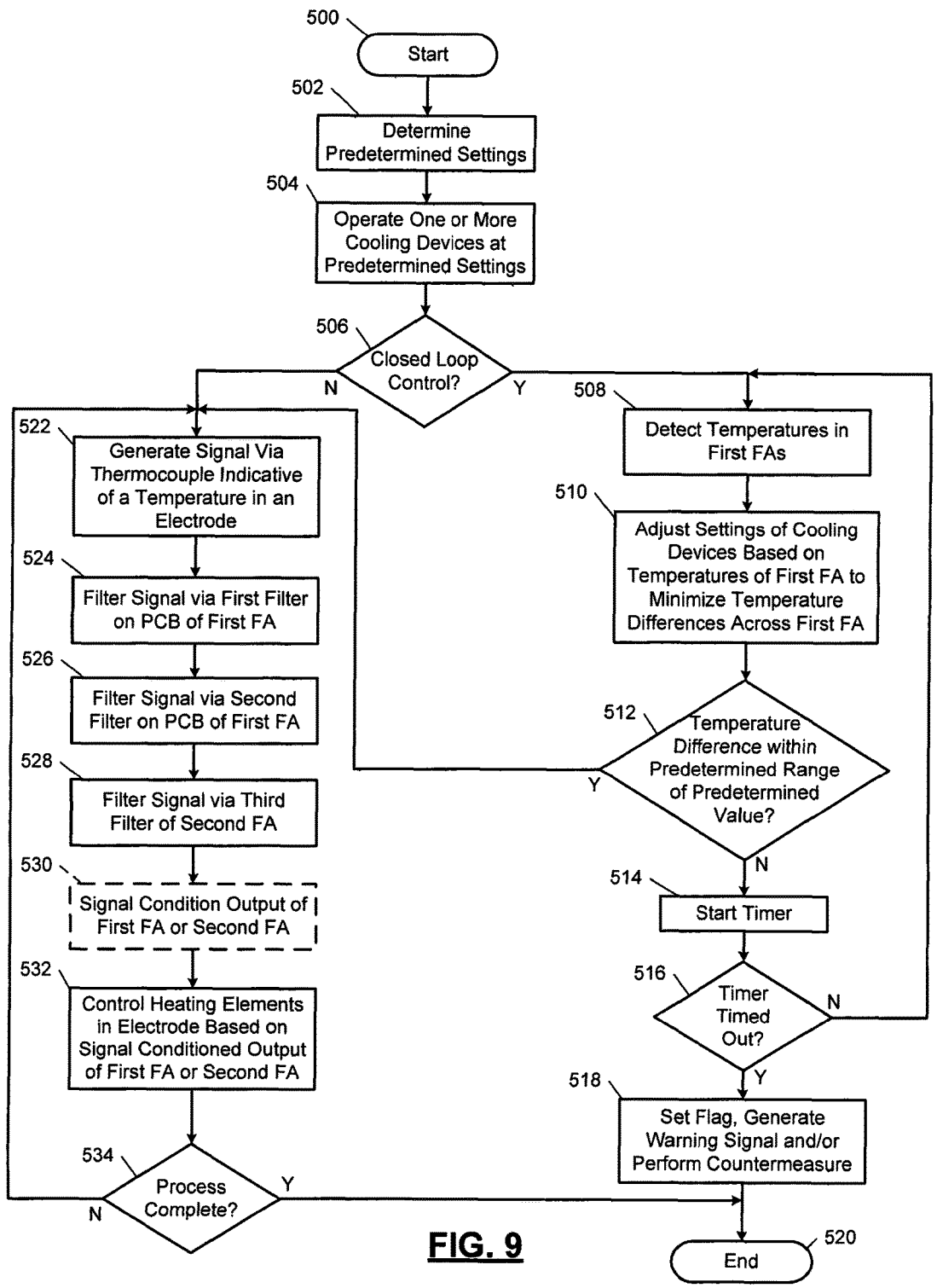
FIG. 9 illustrates an example of a temperature control method according to the present disclosure.

For further defined structure of the controllers of FIGS. 1-8 see below provided method of FIG. 9 and below provided definition for the term "controller". The systems disclosed herein may be operated using numerous methods, an example method is illustrated in FIG. 9. In FIG. 9, a temperature control method of operating a system is shown. Although the following tasks are primarily described with respect to the implementations of FIG. 9, the tasks may be easily modified to apply to other implementations of the present disclosure. The tasks may be iteratively performed. The tasks may be performed for each station in a plasma chamber.

The method may begin at 500. At 502, a temperature controller (e.g., one of the temperature controllers 142, 272, 292 of FIGS. 1-5) may determine predetermined settings for one or more cooling or temperature regulating devices (e.g., the fans 190 of FIG. 1, the cooling devices 282 of FIG. 4, and/or the valves 298 and the pump 300 of FIG. 5) a current recipe and/or process being performed. The predetermined settings may include predetermined speeds, frequencies, duty cycles, pressures, valve positions, etc. to maintain one or more first filter assemblies (FAs) (e.g., any of the first FAs disclosed herein, such as one or more of the first FAs 186, 204, 238, 350 of FIGS. 1-5 and 7) at a predetermined temperature. The predetermined settings are set to minimize temperature differences across the first FAs between the input terminals and the output terminals of the first FAs (e.g., difference between T2 and T1 in FIG. 6 and/or difference between temperatures at (i) terminals 390, 392, and (ii) terminals 394, 396 of FIG. 7). The settings may be set such that the temperature differences are at a predetermined value (e.g., zero) or within a predetermined range of the predetermined value. The settings may be based on tabular values relating certain process parameters, process steps, recipe values, etc. to the predetermined settings of the cooling and/or temperature regulating devices. The settings may be stored in and/or accessed by the temperature controller.

At 504, the temperature controller may operate the one or more cooling or temperature regulating devices at the predetermined settings. At 506, the temperature controller may determine whether closed loop control is being performed. If closed loop control is being performed, task 508 is performed, otherwise task 522 is performed. If closed loop control is not performed and as a result open loop control is performed, task 504 may be performed while tasks 522-534 are performed. If closed loop control is performed, the predetermined settings may be adjusted during tasks 508-516. Tasks 508-516 may be performed for each of the first FAs. Tasks 522-534 may be performed for each station.

Tasks 508-516 may be iteratively and/or continuously performed while tasks 522-532 are performed.

At 508, the temperature sensors 356, 358 of FIG. 7 or other temperature sensors may be used to detect temperatures across the first FAs. The temperature sensors may generate temperature signals indicative of the temperatures at the inputs and outputs of the first FAs. The temperature signals may be provided to a filter controller (the filter controller 294 or the filter assembly controller 410 of FIGS. 5 and 7).

At 510, if (i) the temperatures are not at a predetermined temperature (e.g., 70° C.), (ii) a difference in temperatures across one or more of the first FAs is not zero or at the predetermined value, or (iii) a difference in temperatures across one or more of the first FAs is outside a predetermined range from the predetermined value, then the settings of the cooling and/or temperature regulating devices may be adjusted accordingly. These adjustments are made based on the detected temperatures of the first FA and the predetermined temperature for the first FA. This may include zones cooling including adjusting an amount of cooling at an input of a first FA to be different than an amount of cooling at an output of the first FA or vice versa. For example, a rate and/or a pressure of a gas/cooling fluid provided across the input of the first FA or through a cooling block near the input of the first FA may be different than a rate or pressure of a gas/cooling fluid provided across the output of the first FA or through the cooling block near the output of the first FA. For example, a cooling fluid passing through a channel of a cooling block under the inputs of the first FA may be flowing at a different rate and/or be at a different pressure than a cooling fluid being passed through a second channel of the cooling block under the outputs of the first FA.

At 512, if the temperature differences are within a predetermined range of the predetermined value, task 522 is performed; otherwise task 514 may be performed. At 514, a timer may be started. The timer may be located with the temperature controller. At 516, if a time on the timer has exceeded a predetermined period or the timer has timed out, task 518 may be performed, otherwise task 508 may be performed.

At 518, an alert flag may be set and/or a warning signal may be generated to indicate that a temperature difference across a first FA has not been reduced to be at the predetermined value (or zero) or within the predetermined range of the predetermined value. Alternatively or in addition to setting the flag and/or generating the warning signal, another countermeasure may be performed. For example, a processing step of a wafer may be stopped or prevented from continuing to a next step. Subsequent to task 518, the method may end at 520.

At 522, a thermocouple within a showerhead generates one or more signals. Tasks 522-532 may be performed for each of the signals generated. For example, as in FIGS. 3-5, if a thermocouple generates a first signal primarily for solid-state relay control and a second signal for over current protection, then a first version of tasks 522-532 is performed for the first signal while a second version of tasks 522-532 is also performed for the second signal. The second version may be performed while the first version is performed.

At 524, the signals generated at 522 are filtered by first filters (e.g., band blocking filters 362, 366) on a PCB of a first FA. At 526, outputs of the first filters are filtered by second filters (e.g., the low pass filters 364, 368) on the PCB of the first FA. At 528, outputs of the second filters may be filtered by third filters (e.g., 244, 246) of a second FA (e.g., one of the second FAs 188, 206, 244, 246). At 530, outputs of the second filters or the third filters, depending on whether the outputs of the second filters are filtered by third filters, are conditioned via an isolation device.

At 532, heating elements and/or cooling of the showerhead are controlled based on the outputs of the isolation device, as described above. This may include (i) controlling an amount of AC current provided to solid-state relays (e.g., the solid-state relays 250 of FIGS. 3-5), and/or (ii) controlling states of the solid-state relays and amounts of the AC current supplied to the heating elements.

At 534, if a processing step of the wafer is complete and/or the processing of the wafer is complete, the method may end at 520; otherwise task 502, 506, 508 or 522 may be performed subsequent to task 534.

The above-described tasks are meant to be illustrative examples; the tasks may be performed sequentially, synchronously, simultaneously, continuously, during overlapping time periods or in a different order depending upon the application. Also, any of the tasks may not be performed or skipped depending on the implementation and/or sequence of events.

Figure 10:
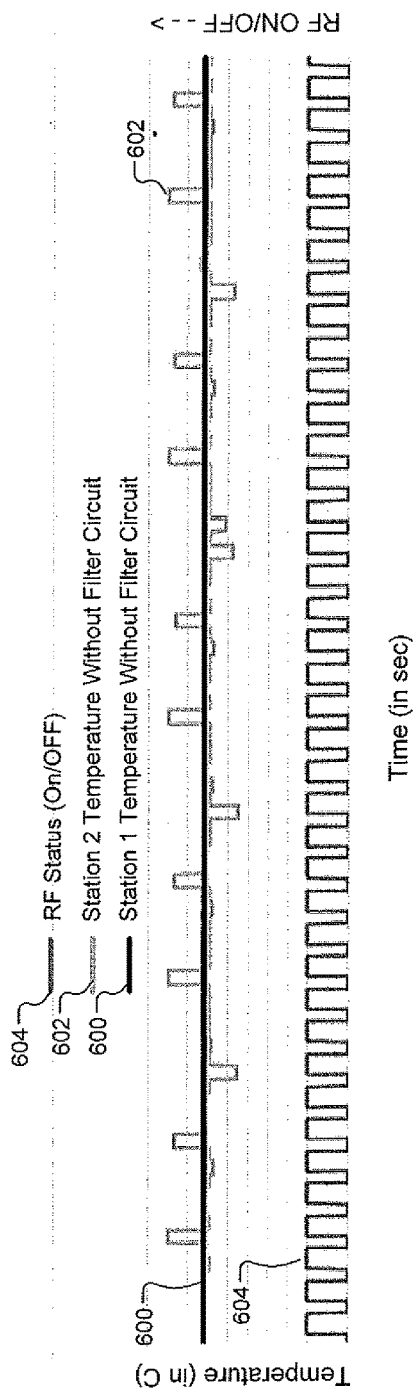
FIG. 10 is a plot illustrating examples of station temperatures with traditional filtering.

FIG. 10 is a plot illustrating station temperatures with traditional filtering. A first temperature signal 600 for a first electrode of a first station, a second temperature signal 602 for a second electrode of a second station, and an RF status signal 604 are shown. The second temperature signal 602 overlaps the first temperature signal 600 except during certain periods of time along a performed process, where the second temperature signal 602 is higher or lower than the first temperature signal 600. The temperature signals 600, 602 are provided using traditional filtering, which includes core-based low pass filters, similar to the low pass filters shown in FIG. 8. The RF status signal 604 indicates when RF voltages are supplied to the electrodes.

Insulation of the second electrode (or showerhead) associated with the second temperature signal 602 has degraded, such that inaccurate DC voltage signals are being detected by a thermocouple of the second electrode. For this reason and although the second electrode is experiencing the same cooling or temperature regulation as the first electrode, the second temperature signal deviates from the first temperature signal, as shown.

Figure 11:
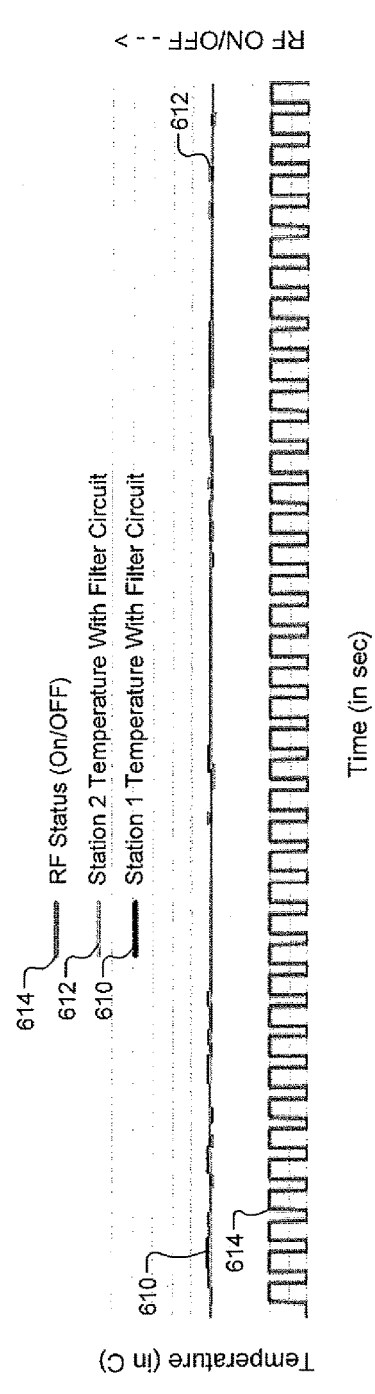
FIG. 11 is a plot illustrating examples of station temperatures with filtering according to the present disclosure.

FIG. 11 is a plot illustrating station temperatures with filtering as disclosed herein. By filtering signals received from thermocouples as described above with respect to FIGS. 1-9, DC voltage signals of a non-insulation degraded electrode and an insulation degraded electrode match after filtering. This filtering includes the filtering performed by the first FAs. This is shown by temperature signals 600, 602 of FIG. 10. The temperature signals 610, 612 are for the same electrodes as the temperature signals 600, 602 of FIG. 10. A RF status signal 614 is also shown.

The above disclosed examples include RF filtering via PCBAs and signal conditioners of thermocouple signals received from a showerhead. This filters out RF energy that has coupled to thermocouple lines and isolates DC signals perturbing temperature measurements and closed loop temperature control of a showerhead. The RF filtering isolates RF energy to corresponding stations. The PCBAs are temperature controlled and address temperature offsets, which can occur when voltages from a thermocouple (small DC voltages) transfer across conductors. Isolation devices are provided to isolate DC signals generated by sources other than thermocouples from temperature controllers. The isolation devices may isolate the temperature controllers from a chassis ground.

Further, various embodiments are disclosed herein. Although each of the embodiments are described as having certain features, any one or more of the features described with respect to any one embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. When a first element is adjacent to a second element, the first element may be in contact with the second element or the first element may be spaced away from the second element without any intervening element between the first element and the second element. When a first element is between a second element and a third element, the first element may be directly connected to the second element and the third element (referred to as "directly between") or intervening elements may be connected (i) between the first element and the second element, and/or (ii) between the first element and the third element. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

None of the elements recited in the claims are intended to be a means-plus-function element within the meaning of 35 U.S.C. § 112(f) unless an element is expressly recited using the phrase "means for," or in the case of a method claim using the phrases "operation for" or "step for."

What is claimed is:

1. A circuit comprising:
 a first filter assembly implemented on a printed circuit board, the first filter assembly comprising
  a first filter configured to (i) receive a first signal from a first sensor, (ii) prevent passage of a first portion of the first signal, and (iii) output a second signal, wherein the first portion of the first signal is at a first radio frequency, and wherein a second portion of the first signal is indicative of a first temperature of a first electrode in a plasma chamber, and
  a second filter configured to (i) receive the second signal, and (ii) prevent passage of a portion of the second signal, wherein the portion of the second signal is at a second radio frequency, and wherein the second radio frequency is less than the first radio frequency; and
 a controller configured to adjust a temperature of the first electrode based on an output of the second filter.

2. The circuit of claim 1, wherein:
 the first filter is a band stop filter and permits passage of the portion of the second signal; and
 the second filter is a low pass filter.

3. The circuit of claim 1, wherein the controller is configured to control operation of a cooling device to maintain a temperature of the first filter assembly at a predetermined temperature.

4. The circuit of claim 3, wherein the cooling device is a fan.

5. The circuit of claim 3, wherein the cooling device is a valve or a pump.

6. The circuit of claim 3, wherein the controller is configured to control flow of a fluid through a block thermally connected to the first filter assembly to maintain the temperature of the first filter assembly at a predetermined temperature.

7. The circuit of claim 3, wherein:
 the first filter assembly comprises a second sensor and a third sensor;
 an output of the second sensor is indicative of a temperature at an input of the first filter assembly;
 an output of the third sensor is indicative of a temperature at an output of the first filter assembly; and
 the controller is configured to control the cooling device based on the output of the second sensor and the output of the third sensor.

8. The circuit of claim 1, further comprising a third filter separate from the first filter assembly and configured to receive the output of the second filter, wherein:
 the controller is configured to adjust the temperature of the first electrode based on an output of the third filter; and
 the third filter includes thermocouple lines wrapped around a core.

9. The circuit of claim 1, further comprising a second filter assembly comprising:
 a third filter configured to filter an output of the second filter; and
 a fourth filter configured to generate an output based on a second signal from the first sensor, and
 wherein the controller is configured to (i) receive an alternating current based on the output of the fourth filter, and (ii) adjust a temperature of the first electrode based on an output of the third filter.

10. The circuit of claim 1, further comprising an isolation device configured to isolate a direct current from (i) thermocouple lines associated with the first sensor, or (ii) the controller.

11. A system comprising:
 the circuit of claim 1; and
 the first electrode configured to receive a first radio frequency signal and a second radio frequency signal, wherein
  the first radio frequency signal is at a first radio frequency,
  the second radio frequency signal is at a second radio frequency,
  the second radio frequency is less than the first radio frequency,
  the first filter prevents passage of the first radio frequency and permits passage of the second radio frequency, and
  the second filter prevents passage of the second radio frequency.

12. The system of claim 11, wherein the second filter prevents passage of signals at frequencies above a cut-off frequency including the first radio frequency.

13. A circuit comprising:
 a first filter assembly comprising
  a band stop filter configured to (i) receive a first signal from a first sensor, (ii) prevent passage of a first portion of the first signal, and (iii) and output a second signal, wherein the first portion of the first signal is at a first radio frequency, and wherein a second portion of the first signal is indicative of a first temperature of a first electrode in a plasma chamber, and
  a low pass filter configured to (i) receive the second signal, and (ii) prevent passage of a portion of the second signal, wherein the portion of the second signal is at a second radio frequency, and wherein the second radio frequency is less than the first radio frequency; and
 a controller configured to adjust a temperature of the first electrode based on an output of the low pass filter.

14. The circuit of claim 13, wherein:
 the controller is configured to control flow of a fluid through a block thermally connected to the first filter assembly to maintain the temperature of the first filter assembly at a predetermined temperature;
 the first filter assembly comprises a second sensor and a third sensor;
 an output of the second sensor is indicative of a temperature at an input of the first filter assembly;
 an output of the third sensor is indicative of a temperature at an output of the first filter assembly; and
 the controller is configured to control a cooling device based on the output of the second sensor and the output of the third sensor to maintain the first filter assembly at a predetermined temperature.

15. The circuit of claim 13, further comprising a second filter assembly separate from the first filter assembly, wherein:
 the second filter assembly comprises
  a third filter configured to filter an output of the low pass filter, and
  a fourth filter configured to generate an output based on a second signal from the first sensor; and the controller is configured to (i) receive an alternating current based on the output of the fourth filter, and (ii) adjust a temperature of the first electrode based on an output of the third filter.

16. The circuit of claim 1, wherein the controller is configured to adjust the temperature of the first electrode by adjusting an amount of current supplied to the first electrode.

17. The circuit of claim 1, further comprising a plurality of relays, wherein:
the controller is configured to adjust the temperature of the first electrode by adjusting an amount of current supplied to one or more of the plurality of relays; and
the first electrode receives current from the plurality of relays.

18. The circuit of claim 1, wherein the second filter receives the second signal from the first filter.

19. The circuit of claim 1, wherein the first sensor is a thermocouple.

* * * * *